(12) United States Patent
Chun et al.

(10) Patent No.: US 10,115,794 B2
(45) Date of Patent: Oct. 30, 2018

(54) SEMICONDUCTOR DEVICE COMPRISING ACCUMULATION LAYER CHANNEL AND INVERSION LAYER CHANNEL

(71) Applicants: HYUNDAI MOTOR COMPANY, Seoul (KR); Hyundai Autron Co., Ltd., Seongnam-si, Gyeonggi-do (KR)

(72) Inventors: Dae Hwan Chun, Gwangmyeong-si (KR); Youngkyun Jung, Seoul (KR); JongSeok Lee, Suwon-si (KR); Youngjoon Kim, Suwon-si (KR); Taeyeop Kim, Seoul (KR); Hyuk Woo, Incheon (KR)

(73) Assignees: HYUNDAI MOTOR COMPANY, Seoul (KR); HYUNDAI AUTRON CO., LTD., Seongnam-si, Gyeonggi-do (KR)

( * ) Notice: Subject to any disclaimer, the term of this patent is extended or adjusted under 35 U.S.C. 154(b) by 0 days.

(21) Appl. No.: 15/363,892

(22) Filed: Nov. 29, 2016

(65) Prior Publication Data

US 2017/0373154 A1 Dec. 28, 2017

(30) Foreign Application Priority Data

Jun. 24, 2016 (KR) ........................ 10-2016-0079580

(51) Int. Cl.
*H01L 29/94* (2006.01)
*H01L 29/16* (2006.01)
(Continued)

(52) U.S. Cl.
CPC .... *H01L 29/1608* (2013.01); *H01L 21/02529* (2013.01); *H01L 21/30604* (2013.01);
(Continued)

(58) Field of Classification Search
CPC ............ H01L 29/1608; H01L 29/4236; H01L 29/66666; H01L 29/7827
(Continued)

(56) References Cited

U.S. PATENT DOCUMENTS

| 9,054,183 B2 | 6/2015 | Fursin et al. |
| 2014/0097447 A1 | 4/2014 | Lee et al. |
| 2015/0179794 A1* | 6/2015 | Hong ................ H01L 21/02565 257/43 |

FOREIGN PATENT DOCUMENTS

| JP | 2015-072999 A | 4/2015 |
| KR | 10-2007-0083844 A | 8/2007 |

(Continued)

*Primary Examiner* — Matthew E Warren
(74) *Attorney, Agent, or Firm* — McDermott Will & Emery LLP

(57) ABSTRACT

A semiconductor device includes: an n− type layer disposed on a first surface of an n+ type silicon carbide substrate; a first trench formed in the n− type layer; a p type region disposed on both side surfaces of the first trench; an n+ type region disposed on both side surfaces of the first trench and disposed on the n− type layer and the p type region; a gate insulating layer disposed inside the first trench; a gate electrode disposed on the gate insulating layer; an oxide layer disposed on the gate electrode; a source electrode disposed on the oxide layer and the n+ region; and a drain electrode disposed on the second surface of the n+ type silicon carbide substrate, wherein a first channel as an accumulation layer channel and a second channel as an inversion layer channel are disposed in both side surfaces of the first trench, and the first channel and the second channel are disposed to be adjacent in a horizontal direction for the first surface of the n+ type silicon carbide substrate.

8 Claims, 12 Drawing Sheets

(51) Int. Cl.
    *H01L 21/02*     (2006.01)
    *H01L 21/306*     (2006.01)
    *H01L 29/423*     (2006.01)
    *H01L 29/66*     (2006.01)
    *H01L 29/78*     (2006.01)

(52) U.S. Cl.
    CPC .... *H01L 29/4236* (2013.01); *H01L 29/66666* (2013.01); *H01L 29/7827* (2013.01)

(58) Field of Classification Search
    USPC .......................................... 257/77, 330–332
    See application file for complete search history.

(56) References Cited

FOREIGN PATENT DOCUMENTS

| | | |
|---|---|---|
| KR | 10-0935165 B1 | 1/2010 |
| KR | 10-2014-0044075 A | 4/2014 |
| KR | 10-2015-0076840 A | 7/2015 |

* cited by examiner

SEMICONDUCTOR DEVICE COMPRISING ACCUMULATION LAYER CHANNEL AND INVERSION LAYER CHANNEL

CROSS-REFERENCE TO RELATED APPLICATION

This application claims the benefit of priority to Korean Patent Application No. 10-2016-0079580, filed in the Korean Intellectual Property Office on Jun. 24, 2016, the entirety of which is incorporated herein by reference.

TECHNICAL FIELD

The present disclosure relates to a semiconductor device including silicon carbide (SiC), and a manufacturing method thereof.

BACKGROUND

With the recent trend toward large-sized and large-capacity application apparatuses, a power semiconductor device having a high breakdown voltage, a high current capacity, and high-speed switching characteristics has become necessary.

Such a power semiconductor device should have a low on-resistance or a low saturated voltage in order to lower power loss in a conduction state when a very large current flows. Furthermore, the power semiconductor device should be able to endure a backward high voltage of a PN junction which is applied to both ends of the power semiconductor device in an off state or at the moment when the switch is turned off, that is, a high breakdown voltage characteristic.

Among power semiconductor devices a metal oxide semiconductor field effect transistor (MOSFET) is most commonly used as a field effect transistor in a digital circuit and an analog circuit.

A MOSFET using silicon carbide (SiC) may reduce an on-resistance to reduce power consumption, but electron mobility of the channel may be low such that there may be high channel resistance. A silicon carbide MOSFET applied with a trench gate having an accumulation channel has been developed to mitigate this.

The above information disclosed in this Background section is only for enhancement of understanding of the background of the disclosure and therefore it may contain information that does not form the prior art that is already known in this country to a person of ordinary skill in the art.

SUMMARY

The present disclosure reduces a difficulty of a process of the semiconductor device in a silicon carbide MOSFET applied with a trench gate having an accumulation layer channel.

According to an exemplary embodiment in the present disclosure, a semiconductor device includes: an n− type layer disposed on a first surface of an n+ type silicon carbide substrate; a first trench formed in the n− type layer; a p type region disposed on both side surfaces of the first trench; an n+ type region disposed on both side surfaces of the first trench and disposed on the n− type layer and the p type region; a gate insulating layer disposed inside the first trench; a gate electrode disposed on the gate insulating layer; an oxide layer disposed on the gate electrode; a source electrode disposed on the oxide layer and the n+ region; and a drain electrode disposed on the second surface of the n+ type silicon carbide substrate, wherein a first channel as an accumulation layer channel and a second channel as an inversion layer channel are disposed in both side surfaces of the first trench, and the first channel and the second channel are disposed to be adjacent in a horizontal direction for the first surface of the n+ type silicon carbide substrate.

The n− type layer may include a first portion contacting the n+ type region and the side surface of the first trench.

The first channel may be disposed at the first portion.

The p type region may include a second portion contacting the n+ type region and the side surface of the first trench.

The second channel may be disposed at the second portion.

The semiconductor device may further include a second trench disposed at the p type region and separated from the first trench.

An interval between the first surface of the n+ type silicon carbide substrate and the lower surface of the second trench may be longer than the interval between the first surface of the n+ type silicon carbide substrate and the lower surface of the first trench.

The p type region and the n− type layer may contact each other, and the contact surface of the p type region and the n− type layer may have a step shape.

According to another exemplary embodiment in the present disclosure, a manufacturing method of a semiconductor device includes: forming an n− type layer on a first surface of an n+ type silicon carbide substrate; forming a n+ region on the n− type layer; injecting a p type ion to the n+ region to form a p type region under the n+ region; etching the n+ region, the p type region, and the n− type layer to form a first trench; forming a gate insulating layer in the first trench; forming a gate electrode on the gate insulating layer; forming an oxide layer on the gate electrode; forming a source electrode on the oxide layer and the n+ region; and forming a drain electrode at the second surface of the n+ type silicon carbide substrate. A first channel as an accumulation layer channel and a second channel as an inversion layer channel are formed in both side surfaces of the first trench, and the first channel and the second channel are formed to be adjacent in a horizontal direction for the first surface of the n+ type silicon carbide substrate.

In the step forming the p type region, a portion where the first channel may be formed is blocked by using a mask and the p type ion is injected.

The step forming the first trench may include etching the n+ type region and the p type region to form a second trench, and the first trench and the second trench may be separated from each other.

The manufacturing method of the semiconductor device may further include injecting the p type ion in the lower surface of the second trench in a direction perpendicular to the lower surface of the second trench to expand the p type region.

As described, according to an exemplary embodiment in the present disclosure, by controlling the range of the channel region of the accumulation layer by using the mask, the accumulation layer channel may be easily formed within an allowable error range. Accordingly, a yield of the semiconductor device may be improved.

Also, by injecting the p type ion in the direction perpendicular to the lower surface of the second trench positioned at the p type region to form the p type region, the width and the depth of the second trench may be reduced. Accordingly, the resistance may be reduced by increasing the channel density of the semiconductor device.

DETAILED DESCRIPTION OF THE EMBODIMENTS

Figure 1:
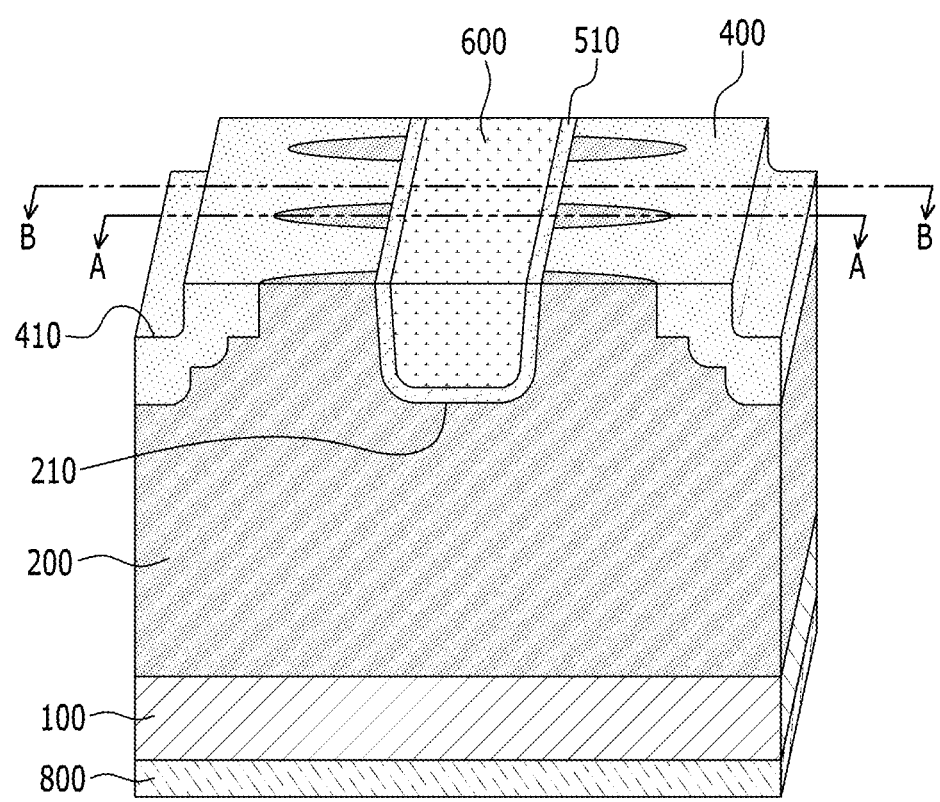
FIG. 1 is a perspective view schematically showing a semiconductor device according to an exemplary embodiment in the present disclosure.

Exemplary embodiments in the present disclosure will be described in detail with reference to the attached drawings. The present disclosure may be modified in many different forms, and should not be construed as being limited to the exemplary embodiments set forth herein. Rather, the exemplary embodiments in the present disclosure are provided so that this disclosure will be thorough and complete, and will fully convey the concept of the present invention to those skilled in the art.

In the drawings, the thickness of layers and regions may be exaggerated for clarity. In addition, when a layer is described to be formed on another layer or on a substrate, this means that the layer may be formed on the other layer or on the substrate, or a third layer may be interposed between the layer and the other layer or the substrate.

Figure 2:
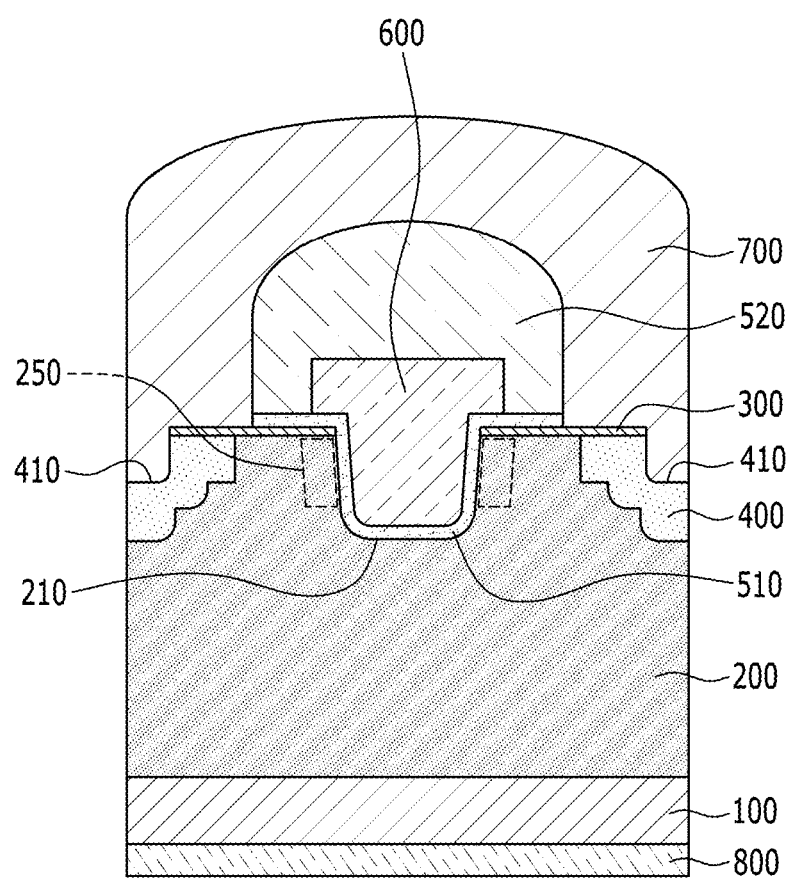
FIG. 2 is a view showing one example of a cross-section taken along a line A-A of FIG. 1.
Figure 3:
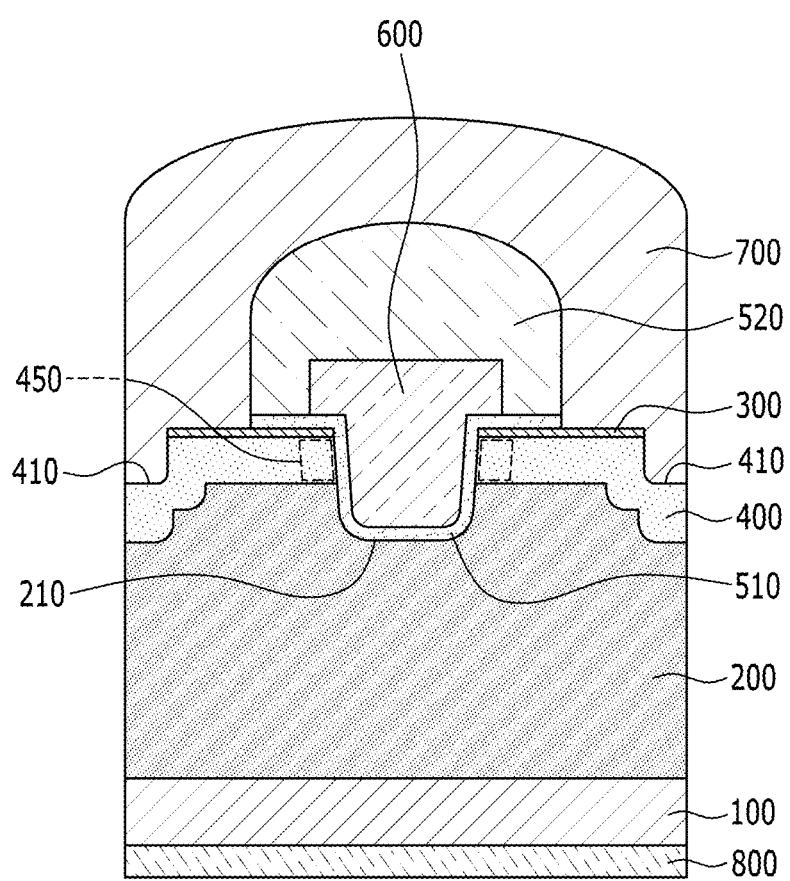
FIG. 3 is a view showing one example of a cross-section taken along a line B-B of FIG. 1.

FIG. 1 is a perspective view schematically showing one example of a semiconductor device according to an exemplary embodiment in the present disclosure. FIG. 2 is a view showing one example of a cross-section taken along a line A-A of FIG. 1. FIG. 3 is a view showing one example of a cross-section taken along a line B-B of FIG. 1.

Referring to FIGS. 1 to 3, a semiconductor device according to the present exemplary embodiment includes an n+ type silicon carbide substrate 100, an n− type layer 200, a p type region 400, an n+ type region 300, a gate electrode 600, a source electrode 700, and a drain electrode 800.

The n− type layer 200 is disposed on a first surface of the n+ type silicon carbide substrate 100, and a first trench 210 is disposed on the n− type layer 200.

The p type region 400 is disposed on both side surfaces of the first trench 210, and a second trench 410 is disposed on the p type region 400. The p type region 400 is disposed on the n− type layer 200, and a surface where the p type region 400 and the n− type layer 200 are in contact has a step shape. An interval between the first surface of the n+ type silicon carbide substrate 100 and the lower surface of the second trench 410 is longer than an interval between the first surface of the n+ type silicon carbide substrate 100 and the lower surface of the first trench 210.

The n+ type region 300 is disposed on the n− type layer 200 and the p type region 400.

A portion of the n− type layer 200 contacts the n+ type region 300 and simultaneously contacts the side surface of the first trench 210. In this case, a portion of the n− type layer 200 is disposed between the side surface of the first trench 210 and the p type region 400 (referring to FIG. 2).

A portion of the p type region 400 contacts the n+ type region 300 and simultaneously contacts the side surface of the first trench 210 (referring to FIG. 3).

A gate insulating layer 510 is disposed in the first trench 210 and the gate electrode 600 is disposed on the gate insulating layer 510. The gate electrode 600 may fill the inside of the first trench 210 and may protrude to the upper side of the first trench 210. The gate electrode 600 may include a polycrystalline silicone or a metal.

An oxide layer 520 is disposed on the gate electrode 600. The oxide layer 520 covers the side surface of the gate electrode 600 protruded from the first trench 210.

The source electrode 700 is disposed on the n+ type region 300, on the oxide layer 520, and inside the second trench 410.

The drain electrode 800 is disposed on the second surface of the n+ type silicon carbide substrate 100. Here, the second surface of the n+ type silicon carbide substrate 100 indicates a surface opposite to the first surface of the n+ type silicon carbide substrate 100. The source electrode 700 and the drain electrode 800 may include the metal. In this case, the metal may be an ohmic metal.

In FIG. 1, to clearly explain the structure of the semiconductor device according to the present exemplary embodiment, the n+ type region 300, the oxide layer 520, and the source electrode 700 are omitted.

The channel of the semiconductor device according to the present exemplary embodiment includes a first channel 250 and a second channel 450. The first channel 250 and the second channel 450 are disposed on both side surfaces of the first trench 210.

The first channel 250 is disposed in the n− type layer 200 that contacts the n+ type region 300, and simultaneously contacts the side surface of the first trench 210 and is the accumulation layer channel. The second channel 450 is disposed in the p type region 400 that contacts the n+ type region 300 and simultaneously contacts the side surface of the first trench 210 and is an inversion layer channel. Here, the first channel 250 and the second channel 450 are positioned to be adjacent in the horizontal direction with respect to the first surface of the n+ type silicon carbide substrate 100.

If a voltage is applied to the gate electrode 600, the electrons and the current flow through the channel from the source electrode 700 to the drain electrode 800. In this case, as the channel includes the first channel 250 that is the accumulation layer channel, the electron and the current are diffused such that the mobility of the electrons and the current may be improved. Accordingly, the on resistance of the semiconductor device may be reduced.

Next, a manufacturing method of the semiconductor device according to an exemplary embodiment in the present disclosure will be described in detail with reference to FIGS. 4 to 8B, as well as FIGS. 2 and 3.

FIGS. 4 to 8B are views showing an example of a manufacturing method of a semiconductor device according to an exemplary embodiment in the present disclosure. FIGS. 5A, 6A, 7A and 8A show an example of the manufacturing method of the cross-section taken along line A-A of FIG. 1, and FIGS. 5B, 6B, 7B and 8B show an example of the manufacturing method of the cross-section taken along line B-B of FIG. 1.

Figure 4:
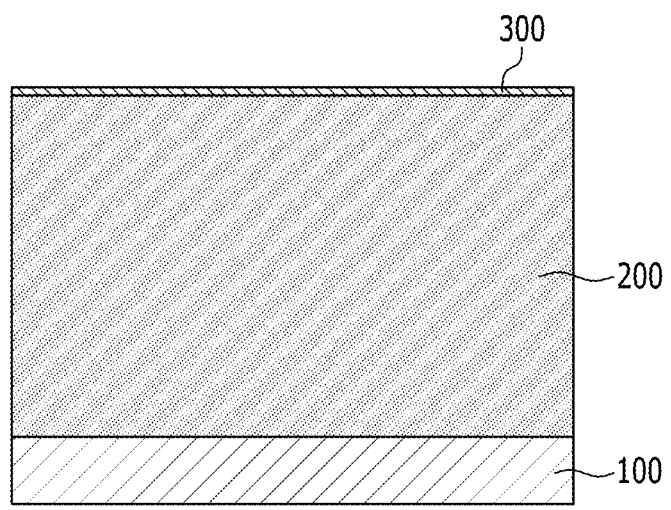
FIG. 4 to FIG. 8B are views showing a manufacturing method of a semiconductor device according to an exemplary embodiment in the present disclosure.

Referring to FIG. 4, the n+ type silicon carbide substrate 100 is prepared, the n− type layer 200 is formed on the first surface of the n+ type silicon carbide substrate 100, and then the n+ type region 300 is formed on the n− type layer 200. The n− type layer 200 may be formed by epitaxial growth or n-ion injection. The n+ type region 300 may also be formed by epitaxial growth or n-ion injection.

Figure 5A:
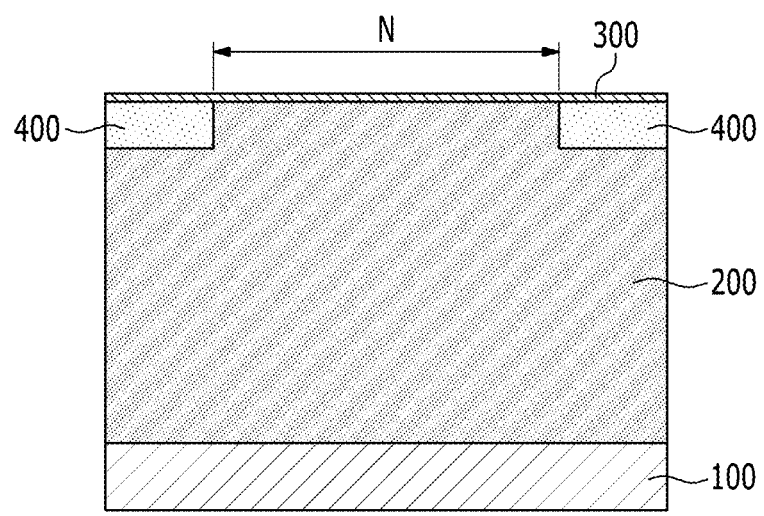
Figure 5B:
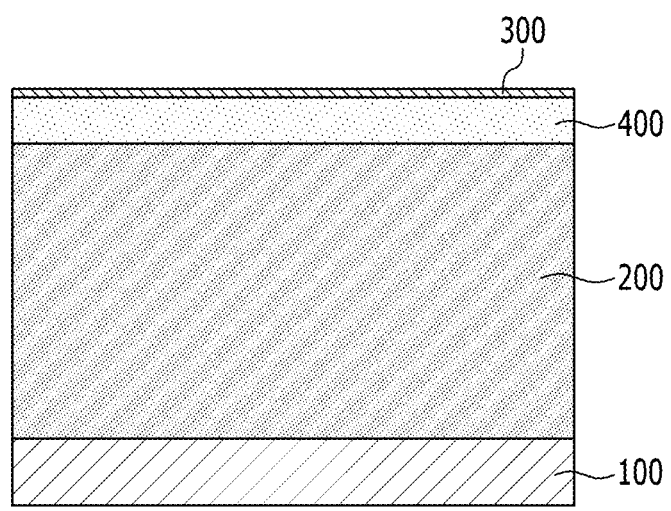

Referring to FIGS. 5A and 5B, the p type ion is injected to the surface of the n+ type region 300 to form the p type region 400. The p type ion is diffused from the n+ type region 300 to the n− type layer 200 such that the p type region 400 is formed under the n+ type region 300.

When injecting the p type ion, by blocking the n− type layer 200 of the portion where the first channel 250 of the described accumulation layer channel is formed by using a mask, the p type ion is injected perpendicularly to the surface of the n+ type region 300. Accordingly, as shown in FIG. 5A, the portion of the p type region 400 is separated by an interval N.

When the accumulation channel region is formed at more than a predetermined permissible error range, it causes a leakage current, and in the present exemplary embodiment, since the range of the n− type layer 200 of the portion where the first channel 250 as the accumulation layer channel is formed may be controlled by using the mask, the first channel 250 as the accumulation layer channel may be easily formed within the permissible error range. Therefore, a yield of the semiconductor device may be improved.

Figure 6A:
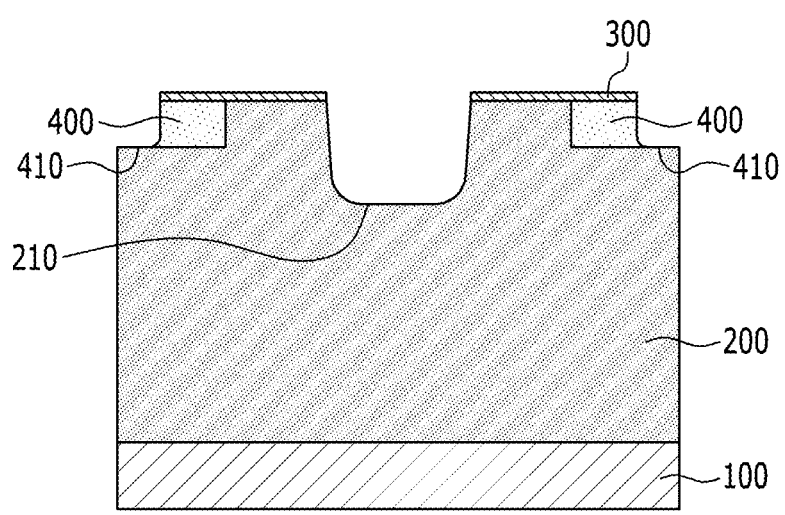
Figure 6B:
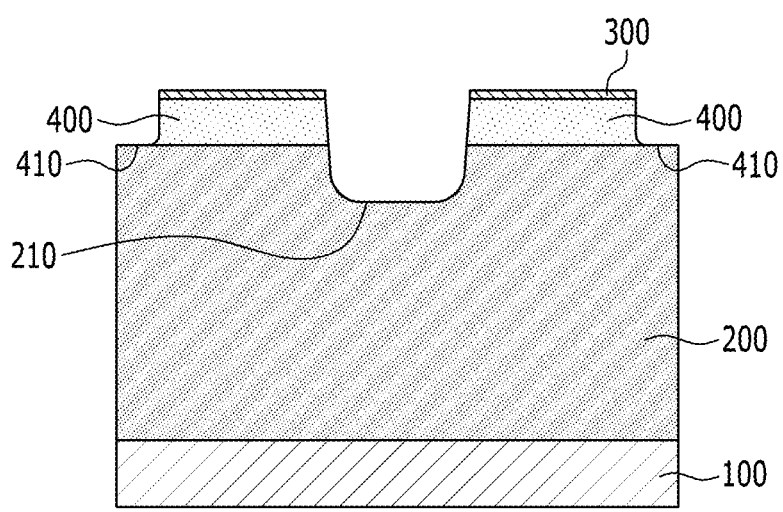

Referring to FIGS. 6A and 6B, the n+ type region 300, the p type region 400, and the n− type layer 200 are etched to form the first trench 210, and the n+ type region 300 and the p type region 400 are etched to form the second trench 410. The first trench 210 and the second trench 410 are separated from each other and the depths thereof may be differently formed. The interval between the first surface of the n+ type silicon carbide substrate 100 and the lower surface of the second trench 410 is longer than the interval between the first surface of the n+ type silicon carbide substrate 100 and the lower surface of the first trench 210.

Figure 7A:
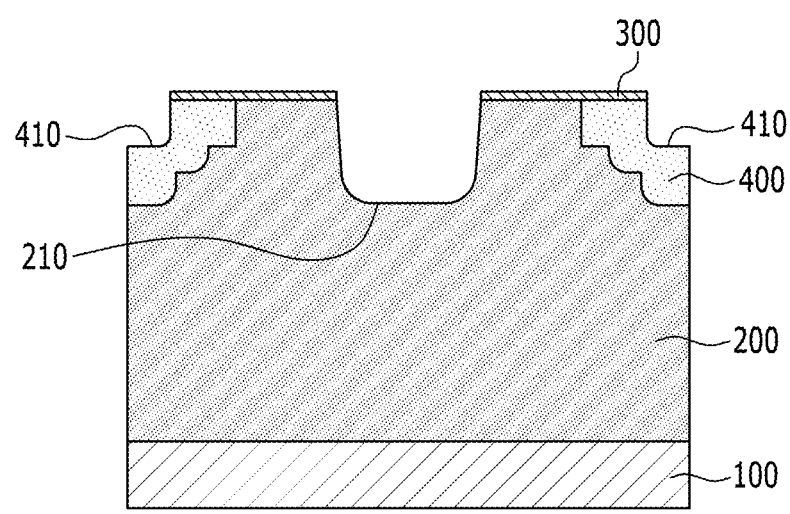
Figure 7B:
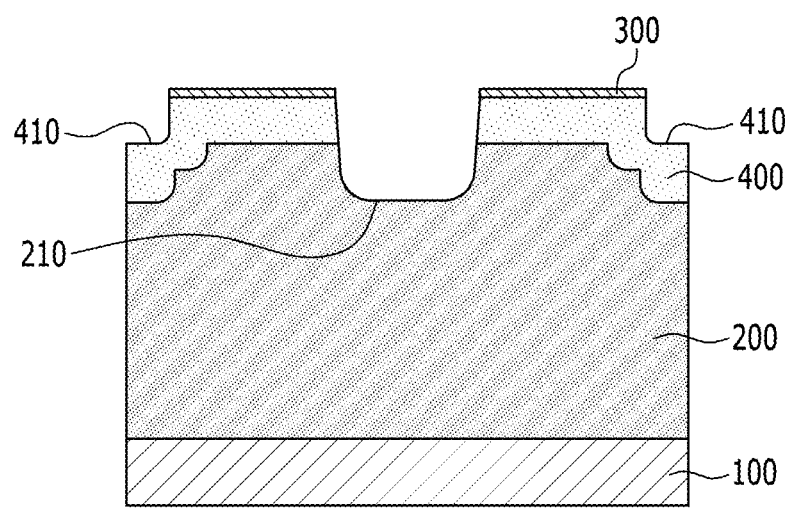

Referring to FIGS. 7A and 7B, the p type ion is injected in the lower surface of the second trench 410 to form the p type region 400. In this case, the p type ion is injected perpendicularly with respect to the lower surface of the second trench 410 and is diffused into the n− type layer 200, and if the p type region 400 and the n− type layer 200 contact, the surface has a step shape.

As described above, after injecting the p type ion to form the p type region 400 (referring to FIGS. 5A and 5B), the second trench 410 is formed, and then the p type ion is injected in the direction perpendicular to the lower surface of the second trench 410 in the lower surface of the second trench 410 to extend the p type region 400 such that the width and the depth of the second trench 410 may be reduced. Therefore, the channel density of the semiconductor device is increased, thereby reducing the resistance.

Figure 8A:
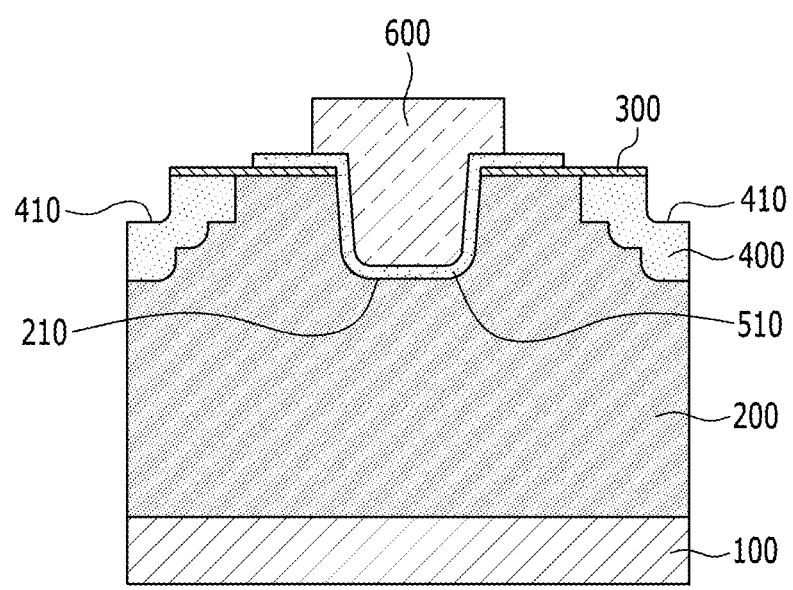
Figure 8B:
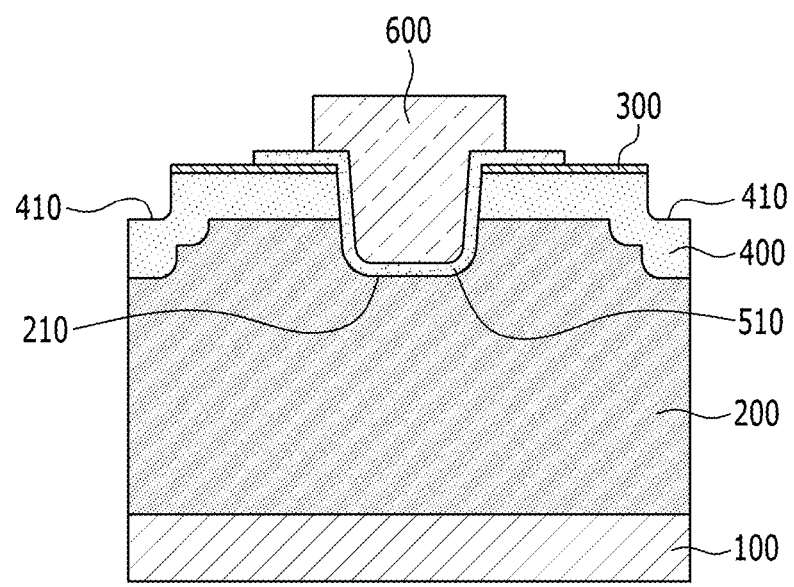

Referring to FIGS. 8A and 8B, the gate insulating layer 510 is formed in the first trench 210, and the gate electrode 600 is formed on the gate insulating layer 510. The gate electrode 600 fills the inside of the first trench 210 and may protrude to the upper side of the first trench 210. The gate electrode 600 may be formed of the polycrystalline silicon or the metal.

Referring to FIGS. 2 and 3, after forming the oxide layer 520 on the gate electrode 600, the source electrode 700 is formed on the n+ type region 300 and the oxide layer 520, and inside the second trench 410, and the drain electrode 800 is formed on the second surface of the n+ type silicon carbide substrate 100. Here, the source electrode 700 and the drain electrode 800 may be formed of the metal. In this case, the metal may be the ohmic metal.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A semiconductor device comprising:
an n− type layer disposed on a first surface of an n+ type silicon carbide substrate;
a first trench formed in the n− type layer;
a p type region disposed on both side surfaces of the first trench;
an n+ type region disposed on both side surfaces of the first trench and disposed on the n− type layer and the p type region;
a gate insulating layer disposed inside the first trench;
a gate electrode disposed on the gate insulating layer;
an oxide layer disposed on the gate electrode;
a source electrode disposed on the oxide layer and the n+ region; and
a drain electrode disposed on the second surface of the n+ type silicon carbide substrate,
wherein a first channel as an accumulation layer channel and a second channel as an inversion layer channel are disposed in both side surfaces of the first trench, and
the first channel and the second channel are disposed to be adjacent in a horizontal direction for the first surface of the n+ type silicon carbide substrate.
2. The semiconductor device of claim 1, wherein
the n− type layer includes a first portion contacting the n+ type region and the side surface of the first trench.
3. The semiconductor device of claim 2, wherein
the first channel is disposed in the first portion.
4. The semiconductor device of claim 3, wherein
the p type region includes a second portion contacting the n+ type region and the side surface of the first trench.
5. The semiconductor device of claim 4, wherein
the second channel is disposed at the second portion.
6. The semiconductor device of claim 5, further comprising
a second trench disposed at the p type region and separated from the first trench.
7. The semiconductor device of claim 6, wherein
an interval between the first surface of the n+ type silicon carbide substrate and the lower surface of the second trench is longer than an interval between the first surface of the n+ type silicon carbide substrate and the lower surface of the first trench.
8. The semiconductor device of claim 7, wherein
the p type region and the n− type layer contact each other, and
the contact surface of the p type region and the n− type layer has a step shape.

* * * * *